(12) United States Patent
Matsubara

(10) Patent No.: US 6,514,853 B1
(45) Date of Patent: Feb. 4, 2003

(54) SEMICONDUCTOR DEVICE AND A MANUFACTURING PROCESS THEREFOR

(75) Inventor: Yoshihisa Matsubara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/592,797

(22) Filed: Jun. 13, 2000

(30) Foreign Application Priority Data

Jun. 25, 1999 (JP) .......................................... 11-180619

(51) Int. Cl.⁷ .......................................... H01L 21/4763
(52) U.S. Cl. .................... 438/626; 438/598; 438/599; 438/618; 438/622; 438/627
(58) Field of Search .................. 438/597, 598, 438/599, 618, 622, 626, 627

(56) References Cited

U.S. PATENT DOCUMENTS 5,723,874 A * 3/1998 Baker et al. .................. 257/48
5,824,599 A * 10/1998 Schacham-Diamand et al. . 438/678
6,016,000 A * 1/2000 Moslehi ....................... 257/522
6,253,362 B1 * 6/2001 Anand et al. .................. 716/8

FOREIGN PATENT DOCUMENTS

JP          9-8039      1/1997
JP         10-189597    7/1998

* cited by examiner

*Primary Examiner*—Carl Whitehead, Jr.
*Assistant Examiner*—Jeff Vockrodt
(74) *Attorney, Agent, or Firm*—Scully, Scott, Murphy & Presser

(57) ABSTRACT

There is disclosed a semiconductor device comprising a copper interconnect layer 7 where a copper film is buried in a concave in an insulating film 3 via a barrier metal film, wherein the copper interconnect layer 7 has a line/space ratio of 4.5 or less and an interconnect occupancy of 10 to 60%. It can effectively prevent dishing and erosion, as well as increase and dispersion in an interconnect resistance when forming damascene copper interconnects.

7 Claims, 20 Drawing Sheets

Cross section taken on line A-A'

○ L/S=2.52/0.56 μm ( Line/space ratio  4.5)
△ L/S=2.52/0.84 μm ( Line/space ratio  3)
□ L/S=2.52/1.12 μm ( Line/space ratio  2.3)

○  L/S=0.84/0.28 μm( Line/space ratio   3)
△  L/S=0.84/0.56 μm( Line/space ratio   1.5)
□  L/S=0.84/0.84 μm( Line/space ratio   1)

| level 1 | 77.6% |
| level 2 | 87.5% |
| level 3 | 68.75% |
| level 4 | 81.25% |
| level 5 | 75% |
| level 6 | 75% |
| level 7 | 68.75% | level 1   77.6%
level 2   87.5%
level 3   68.75%
level 4   81.25%
level 5   75%
level 6   75%
level 7   68.75%

SEMICONDUCTOR DEVICE AND A MANUFACTURING PROCESS THEREFOR

BACKGROUND OF THE INVENTION

1. Field of the Invention

This invention relates to a semiconductor device comprising copper interconnects and a manufacturing process therefor.

2. Description of the Prior Art

Recent higher integration in a semiconductor device has increasingly required an interconnect layer having a lower resistance. Copper which is highly resistant to electromigration has been, therefore, widely used as an interconnect material. Copper as an interconnect material cannot be, however, anisotropically etched by RIE (Reactive Ion Etching), and thus is generally subject to a damascene process employing CMP (Chemical Mechanical Polishing). A conventional process for forming copper interconnects using CMP will be described with reference to FIG. 16.

As illustrated in FIG. 16(a), on a silicon substrate 1 are sequentially formed a silicon nitride film 2 with a thickness of 100 nm and a silicon oxide film 3 with a thickness of 1000 nm. Then, in the silicon oxide film 3 are formed by dry-etching a plurality of concaves reaching to the silicon nitride film 2.

Subsequently, as shown in FIG. 16(b), over the whole surface is deposited by sputtering a barrier metal film 4 consisting of Ta and TaN with a thickness of 20 nm. On the surface is then deposited by sputtering a seed metal film consisting of copper for growing copper plating (not shown). The substrate is immersed in an aqueous solution of cupric sulfate and is subsequently subject to electrolytic plating to form a copper film 5 and then annealing. The copper film 5 has a thickness of about 900 nm in its flat area. It is shown in FIG. 16(a).

Then, the copper film 5 is polished by CMP to level the substrate surface. CMP is generally performed using a polishing apparatus as shown in FIG. 17. Herein, a substrate 1 on which a film or films are formed as described above is referred to as a wafer 10. The wafer 10 is placed on the lower face of a wafer carrier 11. While the surface of the wafer 10 on which a film is to be formed is in contact with a polishing pad 12, both of the wafer carrier 11 and the polishing pad 12 are rotated at a certain rate. A polishing liquid 14 is supplied from an inlet 13 by a pump 15 between the wafer 10 and the polishing pad 12. The polishing liquid 14 may be generally a slurry in which an abrasive such as alumina and silica particles is dispersed After exposing the barrier metal film 4 (FIG. 16(c)), the wafer is further polished to be as shown in FIG. 16(d) to form damascene interconnects.

The above process of the prior art may, however, often cause dishing and/or erosion, resulting in a dispersed resistance as it increases. It will be described below in detail.

Dishing will be first described. In the CMP step in FIG. 16(c), it is necessary to ensure an adequate polishing time to avoid remaining of the barrier metal film 4 on the silicon oxide film 3. The copper film 5 is polished substantially faster than the barrier metal film 4. For example, copper is polished by CMP usually 30 times or more as fast as a Ta family metal generally used as a barrier metal film. Consequently, as illustrated in FIG. 16(c), in a process after exposing the barrier metal film 4, the copper film 5 is excessively polished in relation to the barrier metal film 4 to provide a shape as shown in FIG. 19 in which the center of the copper film 5 is concaved. The phenomenon is referred to as "Dishing". Excessive polishing is required to a certain extent for substantially completely removing the barrier metal film 4 on the insulating film 3, generally leading to a certain extent of dishing. Such dishing in the copper film may cause local increase of an interconnect resistance. In addition, it may cause electromigration, leading to a less reliable device.

Next, erosion will be described. As described above, the CMP step in FIG. 16(c) requires a certain period of over polishing. The copper film 5 is polished considerably faster than the barrier metal film 4 or the silicon oxide film 3. It, therefore, causes a CMP rate between a dense interconnect area and an isolated interconnect area during the CMP step after exposing the barrier metal film 4. Specifically, in the dense interconnect area comprising many damascenes in the copper film 5, a relatively higher pressure is applied to the barrier metal film 4 and the silicon oxide film 3, in comparison with the isolated interconnect area comprising less damascenes in the copper film 5. Consequently, CMP may excessively proceed in the dense interconnect area, resulting in the surface concave as illustrated in FIG. 16(d). The phenomena is called "erosion".

Erosion as described above degrades flatness of the substrate surface. Flatness may be more significantly degraded in a multilayer structure to cause significant problems such as short-circuit in interconnects and an increased interconnect resistance due to a reduced cross-section when forming damascene interconnects.

As described above, dishing and erosion are due to the polishing-rate difference between the metal and the barrier metal or the insulating film. In a practical manufacturing process, they are further accelerated by process factors, which will be described below.

FIG. 18 shows a wafer surface when a polishing liquid is supplied. The wafer and a polishing pad are rotated at the substantially same rate in the same direction. When polishing is conducted in such a situation, the periphery of the wafer whose peripheral velocity is higher than that of its inside becomes in contact with more pad surfaces per unit of time. The periphery, therefore, tends to be excessively polished in relation to the inside. In addition, there occurs uneven distribution of the polishing liquid between the periphery and the inside of the wafer surface. The polishing liquid applied dropwise to the polishing pad moves from the periphery to the inside of the wafer to be distributed on the whole surface of the wafer. In the light of the process, a time-mean concentration of the polishing liquid is higher in the periphery than in the inside. It also contributes to excessive polishing of the periphery in comparison with the inside. Furthermore, a wafer comprising metal and/or insulating films is bent with the film side being concaved. Therefore, when the wafer is pushed against the polishing pad 12 for polishing, the above curvature remains to a certain extent, so that the periphery tends to be more polished.

As described above, the wafer periphery is likely to be excessively polished in relation to the inside due to the process factors. A longer over-polishing time is, therefore, required for completing leveling over the whole surface of the wafer. Consequently, dishing and erosion become more prominent.

Such prominent dishing or erosion reduces a film thickness of copper interconnects while increasing an interconnect resistance. Furthermore, a difference in a film thickness becomes larger between copper interconnects, leading to a larger dispersion in an interconnect resistance. Such a difference in a film thickness is particularly significant between the periphery and the inside of the wafer.

Copper interconnects are generally formed by a so-called damascene process employing CMP. In the process, dishing and erosion described above are technically significant problems. To solve these problems, a variety of investigations have been attempted for improving the CMP process; particularly in terms of selection of a polishing liquid and a detection method for a polishing endpoint. However, none of these attempts have been adequately effective to prevent dishing or erosion.

In the light of the above situation, an objective of this invention is to prevent dishing and erosion during forming damascene interconnects and to prevent increase and dispersion in an interconnect resistance.

SUMMARY OF THE INVENTION

Previous attempts to prevent dishing and erosion have been mainly conducted in terms of improvement in a CMP process. On the other hand, according to this invention, a layout of copper interconnects in a horizontal direction is controlled to prevent dishing and erosion. Prevention of dishing and erosion by devising the interconnect layout has been hardly investigated. Our investigation has indicated that dishing and erosion can be effectively prevented by adjusting an interconnect occupancy and/or a line/space ratio to values within ranges different from those in a conventional interconnect design. This invention is based on these observations. This invention will be described.

This invention provides a semiconductor device comprising an interconnect layer where copper interconnects are buried in a concave in an insulating film via a barrier metal film, wherein the interconnect occupancy of the interconnect layer is 10 to 60%.

This invention also provides a process for manufacturing a semiconductor device comprising the steps of depositing an insulating film on a semiconductor substrate surface including a device-forming area and then forming a concave in the insulating film within the device-forming area; depositing a barrier metal film in the concave and forming a copper film to fill the concave; and removing the copper film formed in the area outside the concave by chemical mechanical polishing to form copper interconnects, wherein the interconnect occupancy of the copper interconnects in the device-forming area is 10 to 60%.

Investigations for a semiconductor device have been conventionally conducted for improving an interconnect occupancy, aiming at a highly integrated device. On the contrary, in this invention, an interconnect occupancy is as low as 10 to 60%, which allows dishing and erosion to be effectively prevented when an interconnect layer is formed by a process employing CMP. A CMP process has a variety of advantages for forming copper interconnects because it can pattern copper, a less etchable material, by a relatively convenient procedure. The manufacturing process for a semiconductor device according to this invention can solve the problems of dishing and erosion in such a CMP process, leading to a high-quality and high-productivity process. The semiconductor device according to this invention has a particular structure wherein the interconnect occupancy is within the above range, so that dishing and erosion can be minimized when using a CMP process advantageous for forming copper interconnects, a resistance value can be stable, and a productivity can be satisfactory.

This invention also provides a semiconductor device comprising an interconnect layer where copper interconnects are buried in a concave in an insulating film via a barrier metal film, wherein the interconnect layer comprises an interconnect area in which a plurality of copper interconnects are extended over 100 $\mu$m or more in one direction and an average line/space ratio in the copper interconnects in the interconnect area is 4.5 or less.

This invention also provides a process for manufacturing a semiconductor device comprising the steps of depositing an insulating film on a semiconductor substrate surface including a device-forming area and then forming a plurality of concaves extending over 100 $\mu$m or more in one direction within the device-forming area; depositing a barrier metal film in the concave and forming a copper film to fill the concave; and removing the copper film formed in the area outside the concave by chemical mechanical polishing to form a plurality of copper interconnects, wherein an average line/space ratio in the interconnect area is 4.5 or less.

An interconnect layer often comprises an interconnect area where a plurality of copper interconnects extend over 100 $\mu$m or more in one direction (hereinafter, referred to as "area (a)") and an area where a plurality of copper interconnects extend in two or more directions (hereinafter, referred to as "area (b)"). This invention defines design criteria for area (a). We have conducted investigation, focusing on area (a) where a plurality of copper interconnects extend over 100 $\mu$m or more in one direction and has finally observed that dishing and erosion can be more effectively prevented by setting unique design criteria to the area. This invention is based on the observation.

FIG. 1 shows an example of an interconnect layout in area (a). In the figure, an interconnect layer is formed on a silicon substrate 1 via a silicon nitride film. The interconnect layer has a configuration where a plurality of copper interconnects 7 are formed in the silicon oxide film 3. The copper interconnects 7 are mutually parallel and extend over 100 $\mu$m or more in one direction. In practice, there is a barrier metal film (not shown) between the copper interconnects 7 and the insulating film 3. Area (a) having such a configuration generally constitutes a main part of an intracellular area in a memory cell or a core area in a logic IC such as a CPU.

FIG. 2 shows an example of an interconnect layout in area (b). The interconnect layer comprises wider main interconnects 7a ($V_{DD}$ and $V_{SS}$) and secondary interconnects 7b from the main interconnects to a diffusion layer 8, where the plurality of copper interconnects are vertically and horizontally disposed. In area (b), there is an area where copper interconnects extends in one direction, but their length is different from that in area (a), i.e., 20 $\mu$m or less.

DETAILED DESCRIPTION OF PREFERRED EMBODIMENTS

An interconnect layer in this invention has a configuration where copper interconnects are buried in a concave in an insulating film via a barrier metal film. The insulating film may be, in addition to a conventional silicon oxide film, a film made of a material with a lower dielectric constant for further accelerating a device, including organic films such as a benzocyclobutene (BCB) film, a parylene-N film and a CYTOP film; inorganic films such as a xerogel film and an HSQ (Hydrogen Silisesquioxane) film; and organic-inorganic composite films such as an HMO (Hydrogen peroxide ($H_2O_2$)/Methylsilane-based CVD) film. Among others, an HSQ film (k=2.8 to 3.2) exhibits stabler performance and is suitably used. As used herein, a barrier metal film is a film for preventing buried metal in a contact hole from being dispersed. The barrier metal film may be made of Ti, TiN, TiSiN, W, WN, WSiN, Ta, TaN or TaSiN. Preferable materials are Ta, TaN and TaSiN which can effectively prevent dispersion of copper. The barrier metal film consists of a single film or at least two films made of one or more of the above materials.

Figure 3:
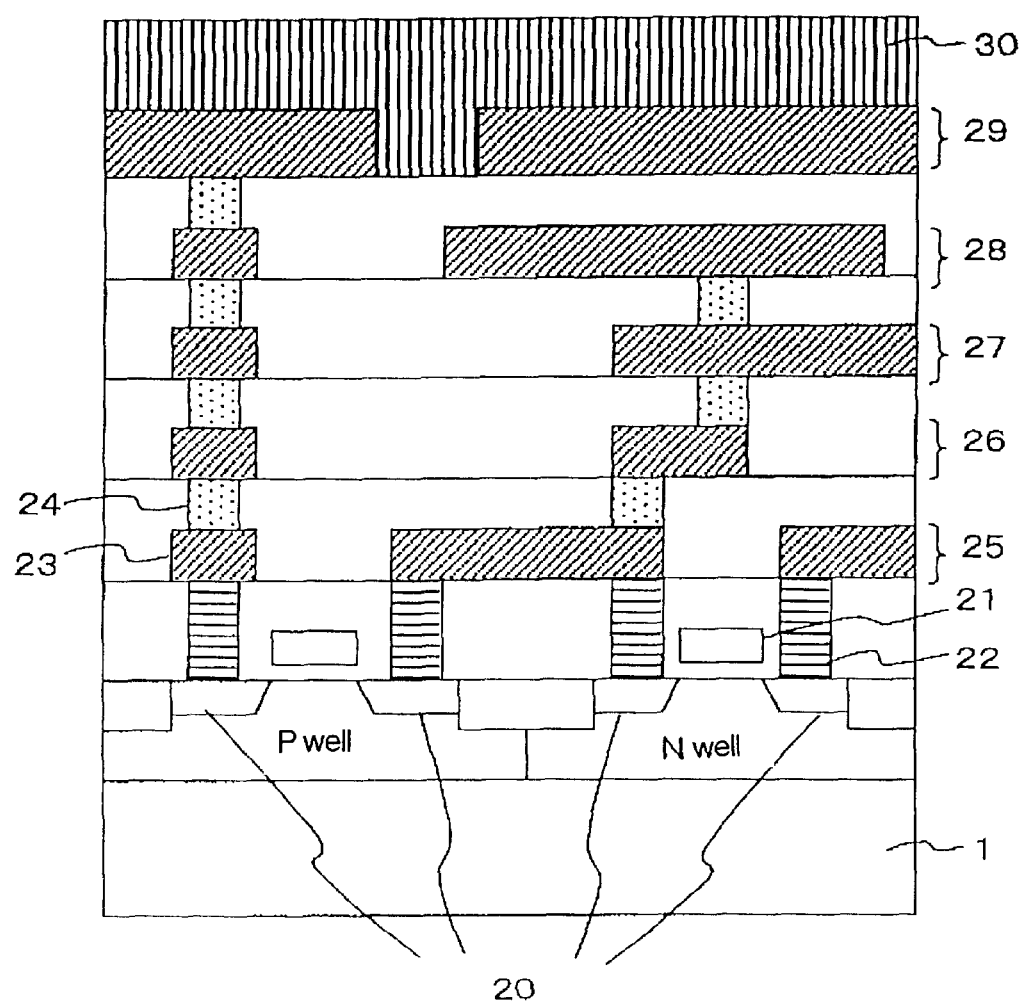
FIG. 3 is a schematic cross section of multilayer interconnects.

As used herein, an interconnect layer is a layer where copper interconnects are buried in an insulating film. The term "layer" as used herein refers to a layer comprising copper interconnects formed by the same process. For example, FIG. 6(d) shows a cross section where copper interconnects are buried at four positions. The layer comprising these copper interconnects corresponds to an interconnect layer as used herein. FIG. 3 is a schematic cross section illustrating an example of multilayer interconnects. In this figure, all of the lowest, the second, the third, the fourth and the fifth interconnect layers 25, 26, 27, 28, 29 has a configuration where copper interconnects are buried in an insulating film. Each of these films corresponds to an "interconnect layer" as used herein.

Figure 1:
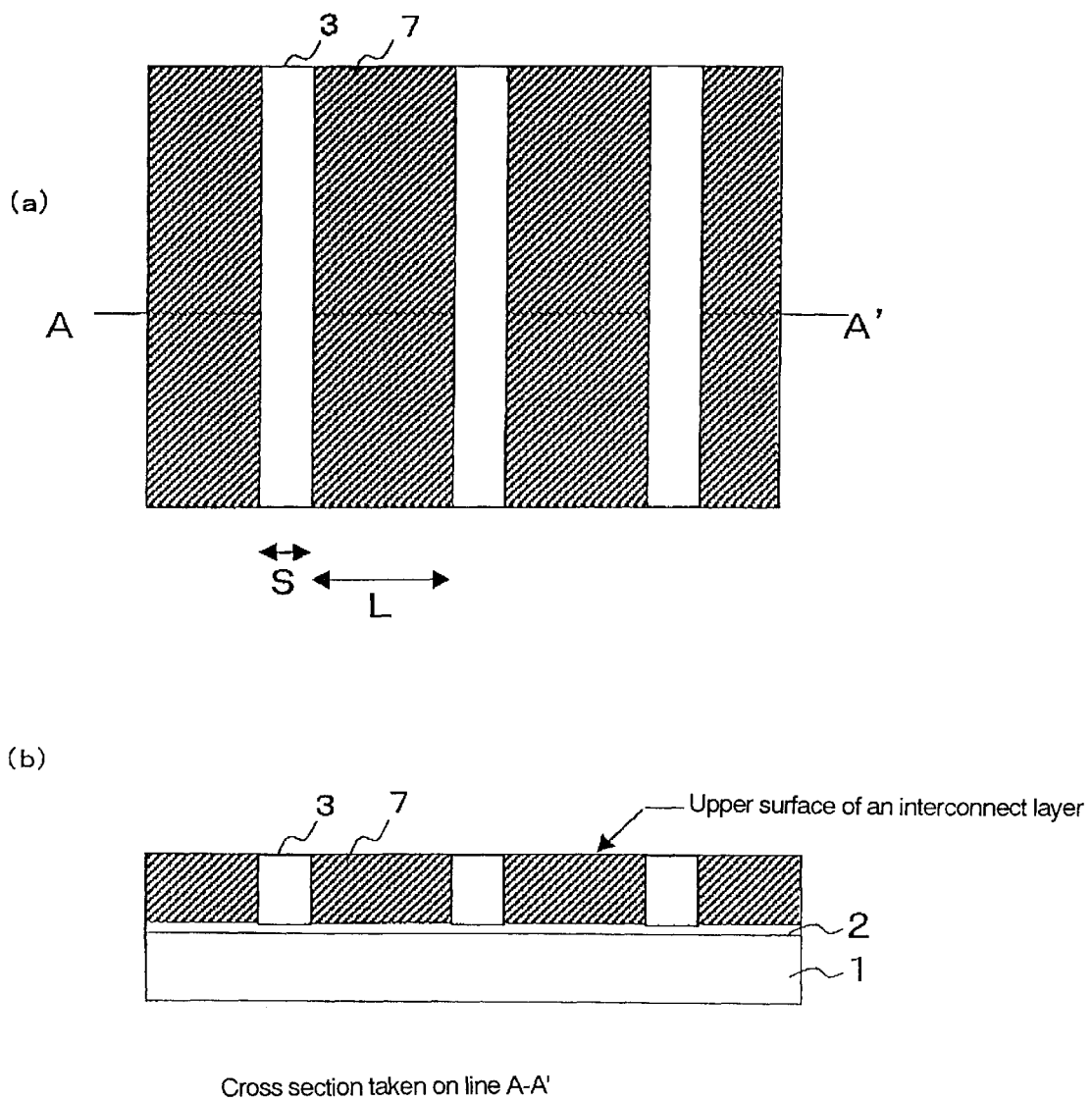
FIG. 1 shows an example of a layout of an interconnect layer.
Figure 2:
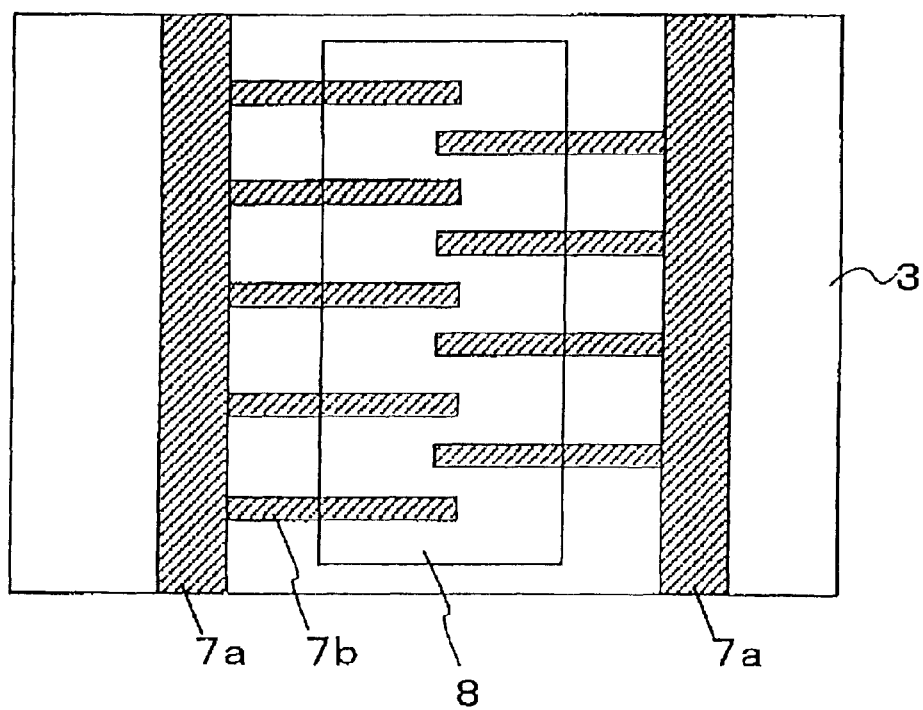
FIG. 2 shows another example of a layout of an interconnect layer.

An interconnect occupancy as used herein is an area ratio of copper interconnects to the whole upper surface of the interconnect layer as defined above. For example, in FIG. 1(a) which is a plan view illustrating the upper surface of the interconnect layer in FIG. 1(b), an area ratio of the hatched area to the rectangle covering the whole surface is an interconnect occupancy. In this invention, the overall interconnect occupancy in the interconnect layer is preferably 60% or less, more preferably 50% or less, which may prevent dishing and erosion and can minimize increase and dispersion in an interconnect resistance. The lower limit for the interconnect occupancy is desirably 10% for avoiding extreme reduction in an interconnect density.

Figure 4:
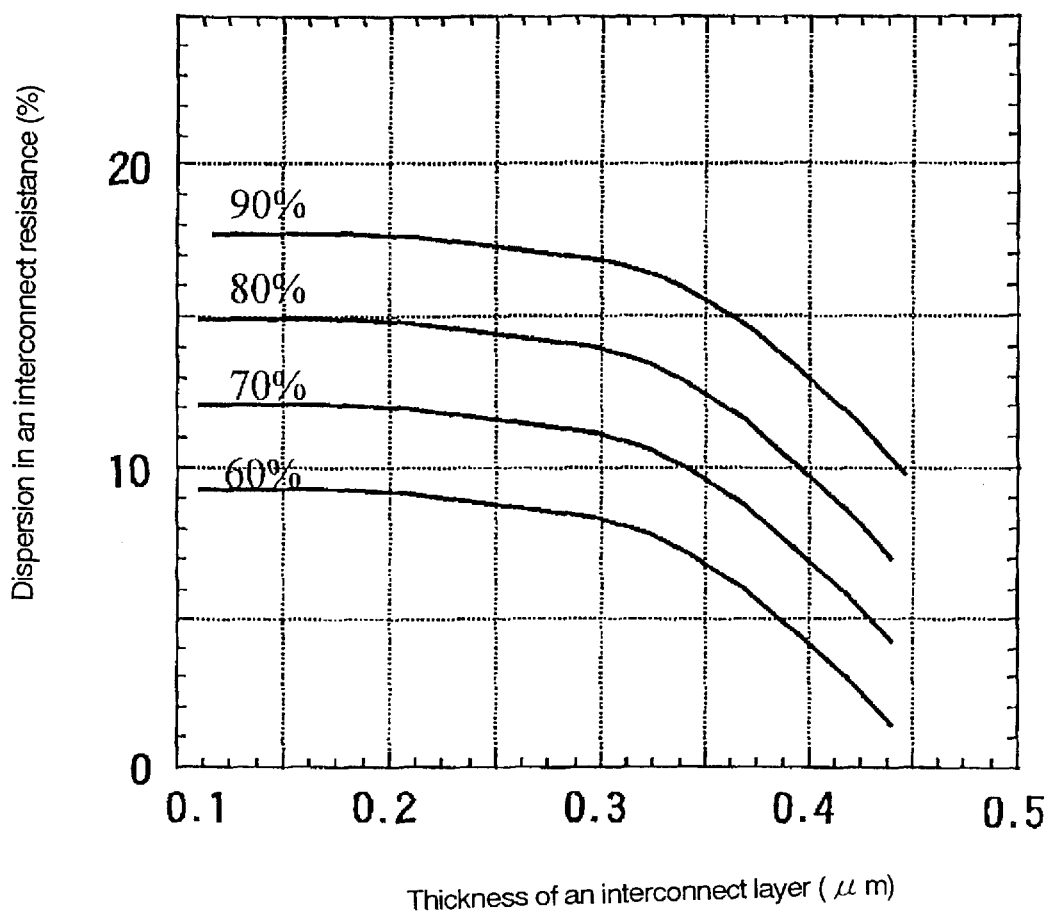
FIG. 4 illustrates relationship between an interconnect film thickness and an interconnect resistance.

FIG. 4 illustrates relationship between an interconnect film thickness and dispersion in an interconnect resistance for a plurality of interconnect layers having different interconnect occupancies. In the values of 60, 70, 80 and 90% in this figure indicate interconnect occupancies. The results in this figure indicate that an interconnect occupancy of 60% or less can meet a required dispersion level of 10% to an interconnect resistance, irrespective of an interconnect film thickness. As described later, the interconnect thickness is desirably 350 nm or less, preferably 300 nm or less for minimizing a parasitic capacitance. The results indicate that for such a film thickness, an interconnect occupancy of 60% or less can give an interconnect resistance of 10% or less.

A line/space ratio as used herein is a value obtained by dividing an interconnect width by a distance between adjacent interconnects (an interconnect distance). For example, in FIG. 1, it corresponds to a value obtained by dividing L by S. There may be formed several types of interconnects with different line/space ratios on the same IC. When there are formed two types of adjacent interconnect areas with different line/space ratios, a line/space ratio is determined for each interconnect area and a value in a boundary for each interconnect area is ignored.

In this invention, when there is an interconnect area where a plurality of copper interconnects extend over 100 μm or more in one direction (area (a)), it is desirable to set unique design criteria for the area. Specifically, a line/space ratio in copper interconnects in area (a) is preferably 4.5 or less, more preferably 4 or less, most preferably 3 or less. It may, as described later in Example 2, effectively prevent dishing and erosion and minimize increase and dispersion in an interconnect resistance. There are no restrictions for a lower limit for the line/space ratio, but it is preferably 0.5 or higher in the light of an interconnect density.

A plurality of interconnects with different line/space ratios may be formed in area (a). In such a case, more prominent effects may be achieved by controlling not only an average line/space ratio but also its distribution. Specifically, the line/space ratio may be up to 5 or more and can effectively minimize a dispersion in an interconnect resistance. As described later in Examples, a line/space ratio of more than 5 makes the dispersion in an interconnect resistance significantly higher. Thus, such interconnects may be eliminated to more effectively minimize a dispersion in the resistance.

In the light of the above description, an IC layout is preferably designed according to, for example, the following procedure.

Step 1: the whole IC is divided into areas of 100 μm×100 μm.

Step 2: areas where a plurality of copper interconnects extend over 100 μm or more in one direction, are extracted from the plurality of areas.

Step 3: for the plurality of areas extracted in Step 2, a line/space ratio is controlled to a given value while an interconnect occupancy in the interconnect layer is 60% or less in the whole IC.

When employing a procedure described in Step 1 in which the whole IC is divided into areas of 100 μm×100 μm, all area (a)s can be extracted to certainly and effectively control the line/space ratio.

An area rate of area (a) to the whole IC is often as high as 60 to 80%. An interconnect occupancy in an interconnect layer, therefore, often depends on a selected line/space ratio in area (a). Thus, in many cases, the interconnect occupancy in an interconnect layer substantially depends on adjustment of a line/space ratio in Step 3.

The plurality of areas extracted in Step 2 are preferably adjusted to have an average line/space ratio of 4.5 or less. The line/space ratio in the areas is more preferably up to 5.

Figure 5:
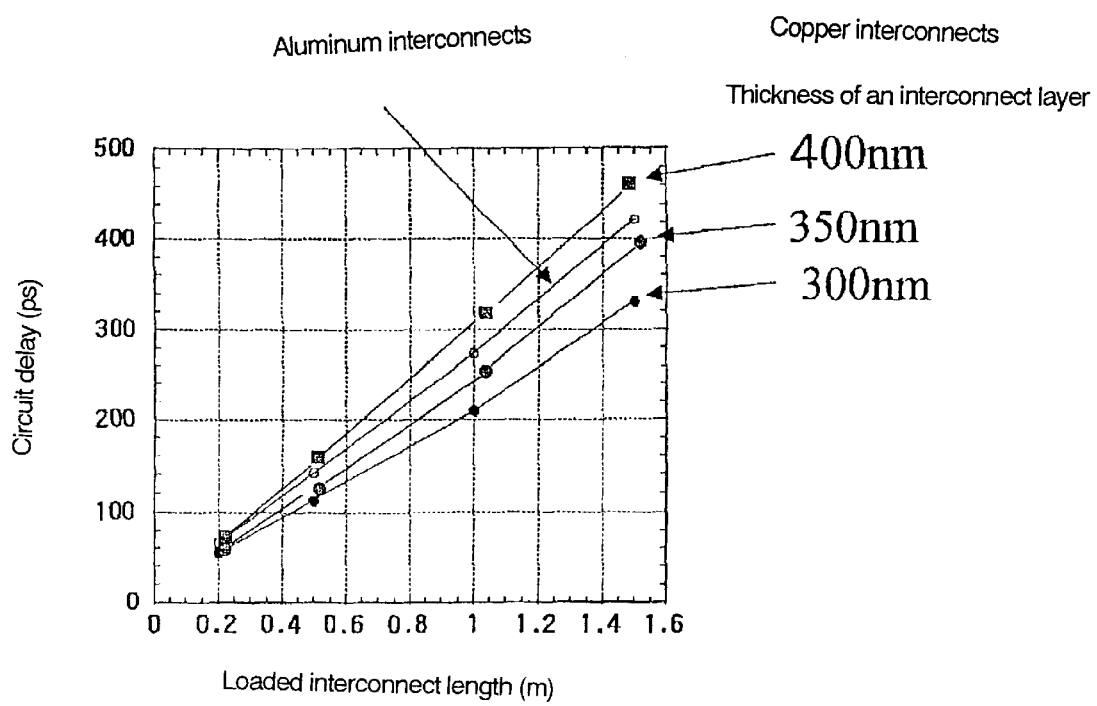
FIG. 5 shows relationship between an interconnect film thickness and an operating speed.

Copper interconnects in this invention preferably have an average film thickness of 350 nm or less, more preferably 300 nm or less. There are no restrictions for its lower limit, but it may be, for example, 50 nm or more. It the film is too thick, a parasitic capacitance between adjacent interconnects may be increased, leading to crosstalk which make a high-speed operation difficult. FIG. 5 shows relationship between an interconnect thickness and an operation speed, where the abscissa and the ordinate indicate a loaded interconnect length and a circuit delay, respectively. A shorter circuit delay to the same interconnect length indicates a higher-speed operation. The thickness of the aluminum interconnects in this figure is 600 nm. Copper interconnects are used mainly for achieving a higher-speed operation than conventional aluminum interconnects. The figure indicates that it can be achieved with a thickness of 350 nm or less, desirably 300 nm or less. When a conventional process is used and a thickness is 350 nm or less, effects of reduction in a thickness due to dishing and erosion become much more prominent. As described above, this invention may be quite effective when applied to an interconnect structure comprising copper interconnects with a thickness of 350 nm or less, particularly 300 nm or less; specifically, thickness reduction can be effectively prevented while realizing a high-speed operation.

This invention is particularly effective when applied to multilayer interconnects. At least some of the plurality of interconnect layers deposited on a semiconductor substrate may meet the requirements defined herein. In particular, it is preferable that the lowest interconnect layer meets the requirements defined herein.

A multilayer interconnect structure will be described with reference to the drawings. FIG. 3 is a cross section illustrating a multilayer interconnect structure in a logic IC. In the figure, an MOS transistor comprising a gate electrode 21 and a diffusion layer 20 is formed on a semiconductor substrate 1. The lowest interconnect layer 25 is connected to the diffusion layer 20 via a contact plug 22. On the lowest interconnect layer 25 are sequentially the second, the third, the fourth and the fifth interconnect layers 26, 27, 28, 29 and finally a passivation film 30 as the top layer. For such a multilayer interconnect structure, the design of the lowest interconnect layer 25 is most important. Dishing or erosion in the lowest interconnect layer may degrade flatness, and as subsequent interconnect layers are deposited, degradation in flatness becomes more prominent. In other words, dishing or erosion in the lowest interconnect layer particularly degrades flatness in the whole multilayer interconnect structure in comparison with that in the upper interconnect layer. Such degradation in flatness tends to cause disconnection in interconnects or misalignment of a mask during forming an interconnect groove or a through hole. Thus, it is desirable to suitably adjust an interconnect occupancy and/or a line/space ratio in the lowest interconnect layer. It is more effective to adjust an interconnect occupancy and/or a line/space ratio in all interconnect layers constituting the multilayer interconnect structure within a suitable range.

In addition, for the lowest interconnect layer, it is particularly necessary to eliminate influence of crosstalk. Copper interconnects must be thin. Copper interconnects generally have a thickness of about 300 nm. For such a thickness, effects of reduction in a thickness due to dishing and erosion become much more prominent as described above. In this respect, the design of the lowest interconnect layer 25 becomes further important.

In a semiconductor device of this invention, an interconnect layer may be formed by a damascene process employing CMP, where the upper surfaces of copper interconnects are leveled by CMP. There are no restrictions for CMP conditions such as a polishing liquid.

Figure 14:
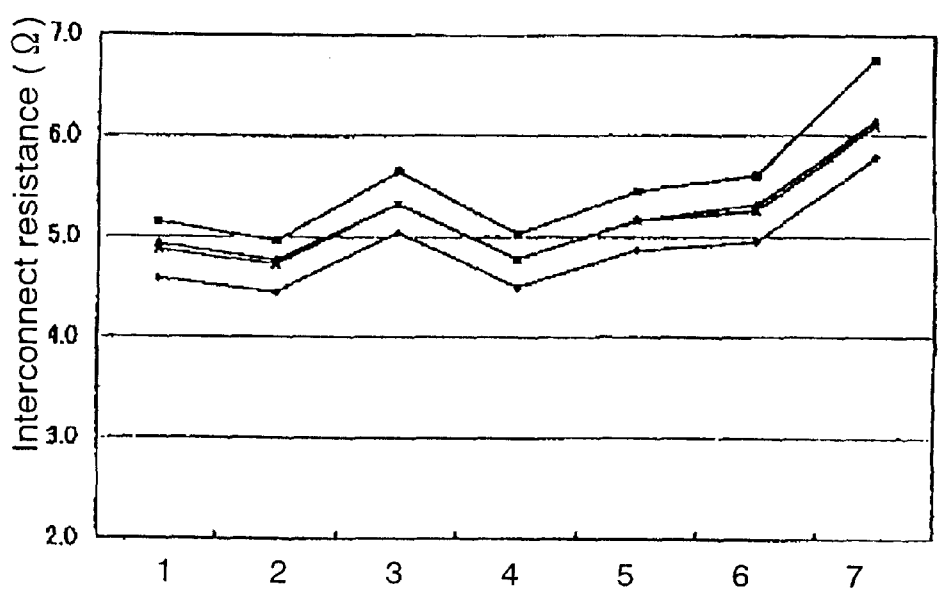
FIG. 14 illustrates relationship between an interconnect occupancy in a probe pad area and an interconnect resistance.
Figure 15:
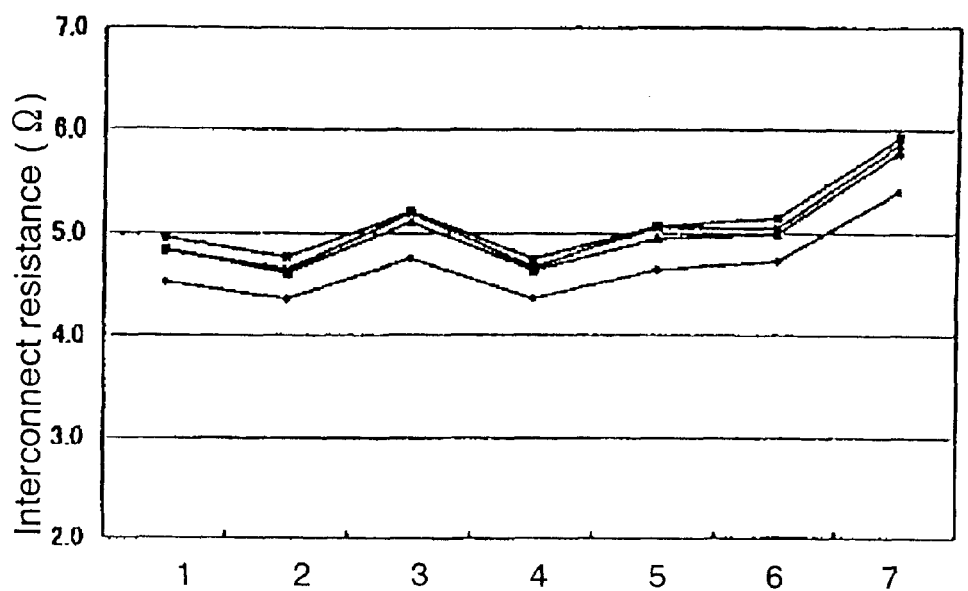
FIG. 15 illustrates relationship between an interconnect occupancy in a probe pad area and an interconnect resistance.
Figure 16:
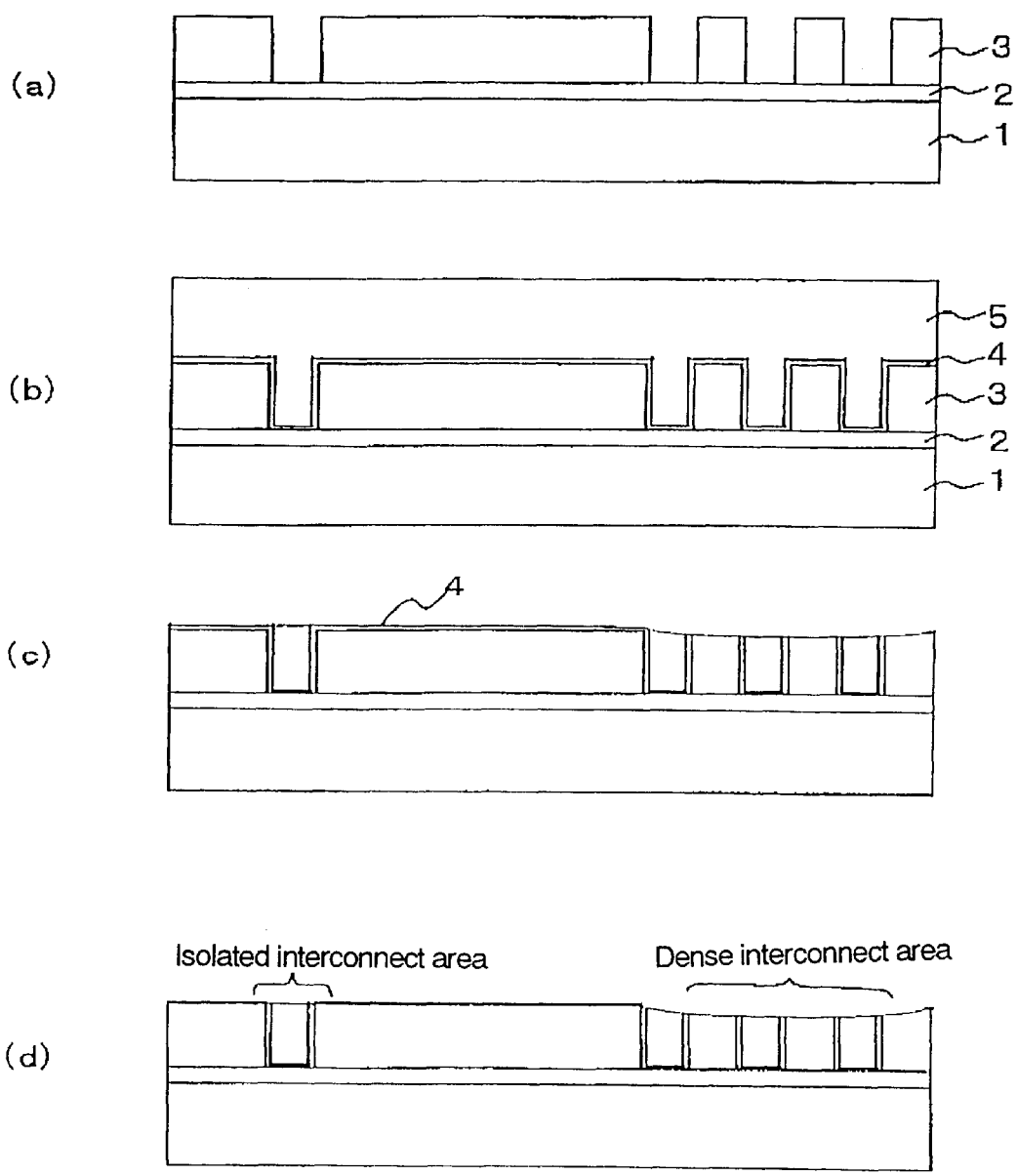
FIG. 16 illustrates a process for forming copper interconnects according to a process for manufacturing a semiconductor device of this invention.
Figure 17:
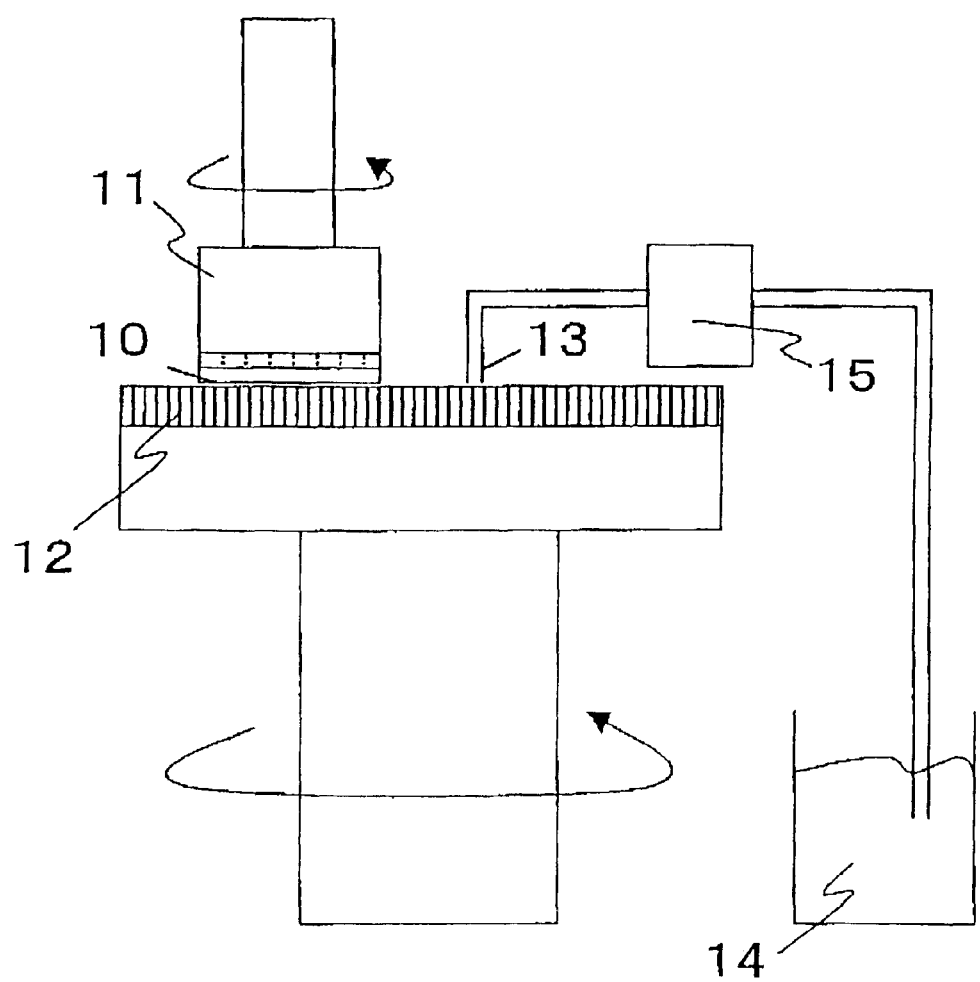
FIG. 17 schematically shows a CMP polishing apparatus.
Figure 18:
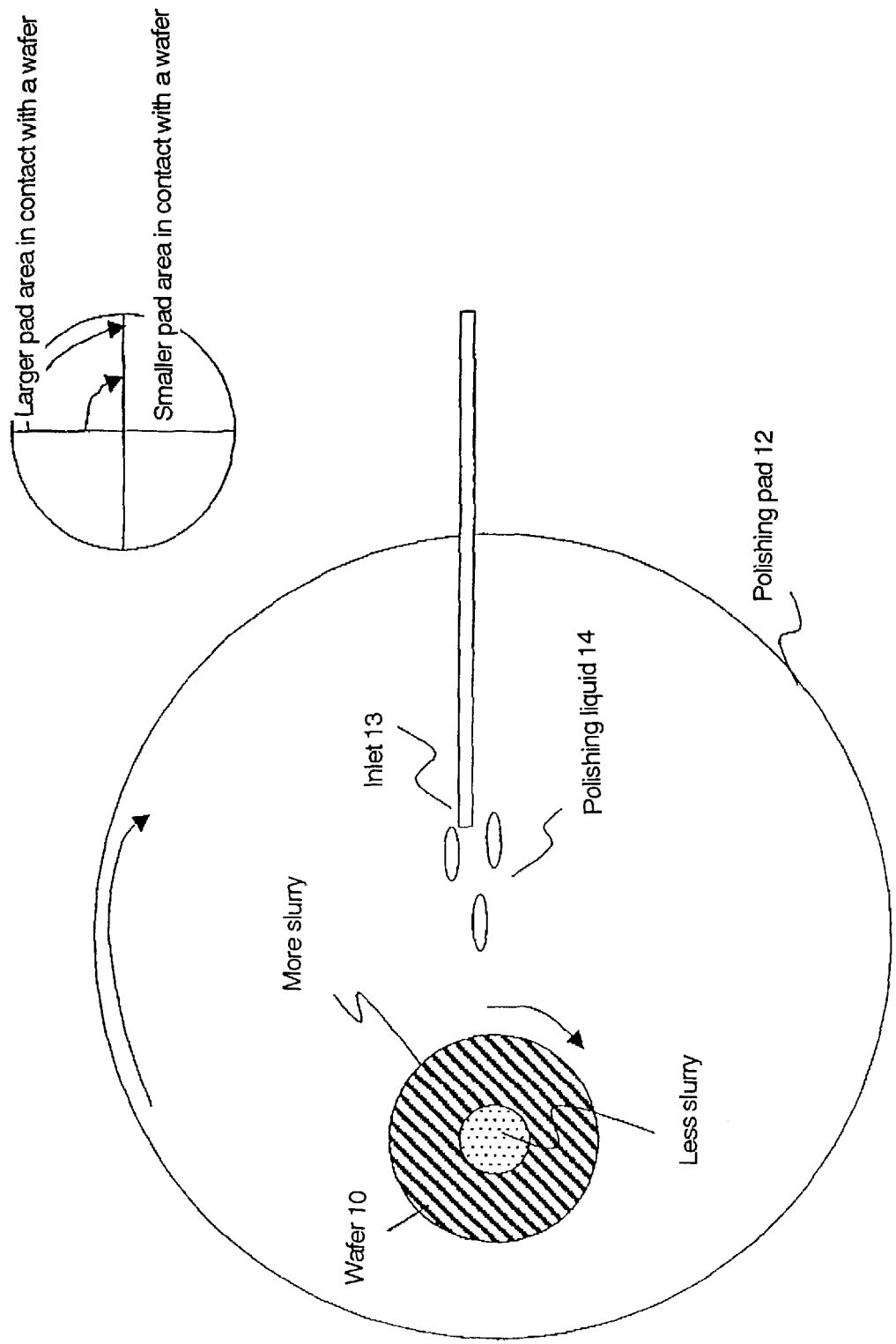
FIG. 18 shows a wafer surface when a polishing liquid is supplied during a CMP process.
Figure 20:
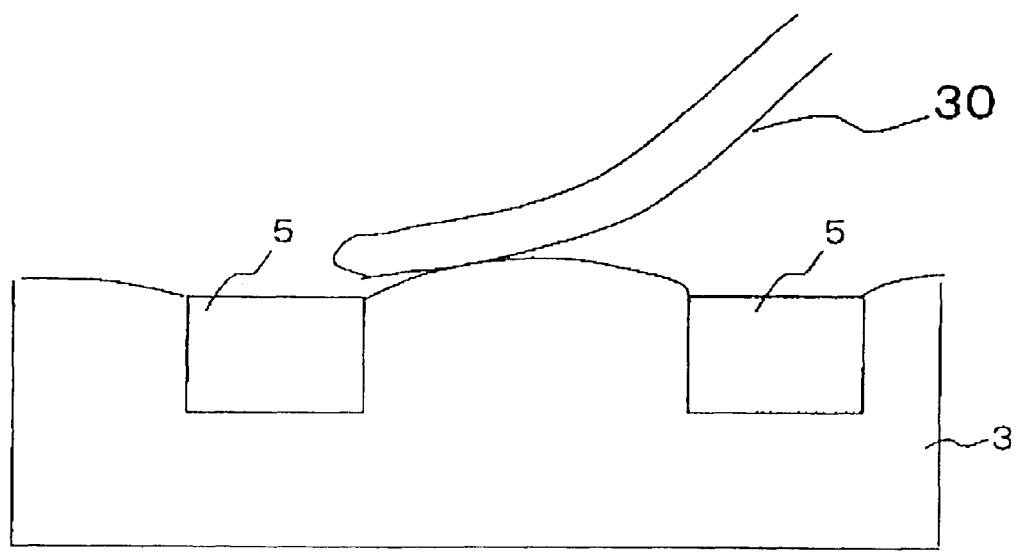
FIG. 20 illustrates problems in measuring a resistance by a probe technique.

An interconnect layer in this invention may further comprise a probe pad area. A probe pad area as used herein is an area comprising a pad which a probe touches when a copper interconnect resistance is checked by a probe technique. In such a configuration, an interconnect occupancy in the probe pad area is preferably 70 to 90%, more preferably 75 to 90%. When a copper interconnect resistance is checked by a probe technique, the tip of the probe 30 may be placed on the insulating film 3 as illustrated in FIG. 20, resulting in contact failure of the probe with the probe pad consisting of copper interconnects 5 and thus incorrect determination. An interconnect occupancy within the above range in the probe pad can avoid the problem. An interconnect occupancy for the whole interconnect layer is preferably 60% or less as described above, while a higher occupancy is desirable for the probe pad area in the layer. It will be described with reference to FIGS. 14 and 15, where the abscissa and the ordinate indicate an interconnect occupancy and a measured interconnect resistance, respectively. For each probe pad area, measurement was repeated four times. The results in these figures indicate that a level 7 (interconnection occupancy: 68.75%) probe pad gave an extremely higher resistance than the others. Thus, it is desirable to adjust an interconnect occupancy for the prove pad area to 70% or higher, more preferably 75% in the light of stability in measurement. Its upper limit is preferably 90% in the light of restrictions for layout.

Figure 7:
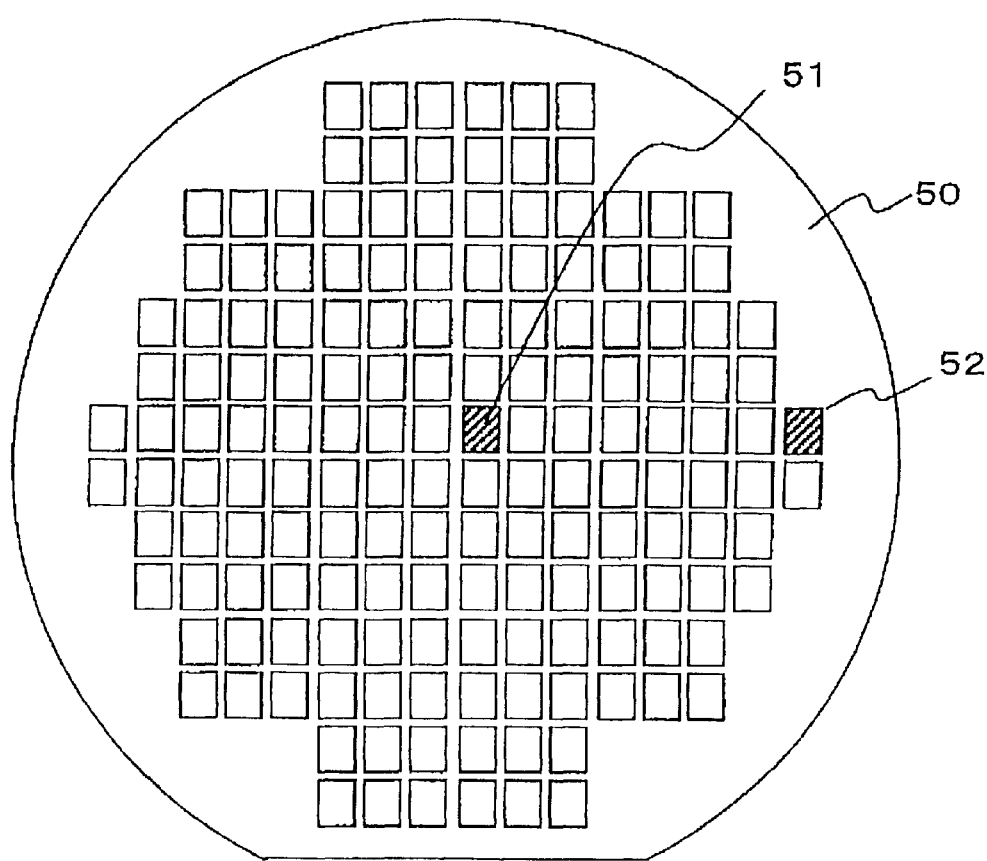
FIG. 7 illustrates an evaluation method in Example 1.

A process for manufacturing a semiconductor device of this invention relates to a process for forming copper interconnects employing a so-called damascene technique. In the process for manufacturing a semiconductor device of this invention, it is essential to adjust a copper-interconnect occupancy in a device-forming area and a line/space ratio within appropriate ranges. A device-forming area as used herein is each area delimited by scribe lines on a wafer, which is removed as a chip in a subsequent step. For example, it corresponds to each rectangular area (chips 51, 52) in FIG. 7.

A process for forming copper interconnects in the manufacturing process of this invention may be a single damascene process wherein an interconnect layer and a through hole are formed in separate steps, or a dual damascene process wherein these are formed in the same step. The copper interconnects can be deposited by any appropriate technique such as plating, CVD and sputtering.

EXAMPLES

Example 1

Figure 8:
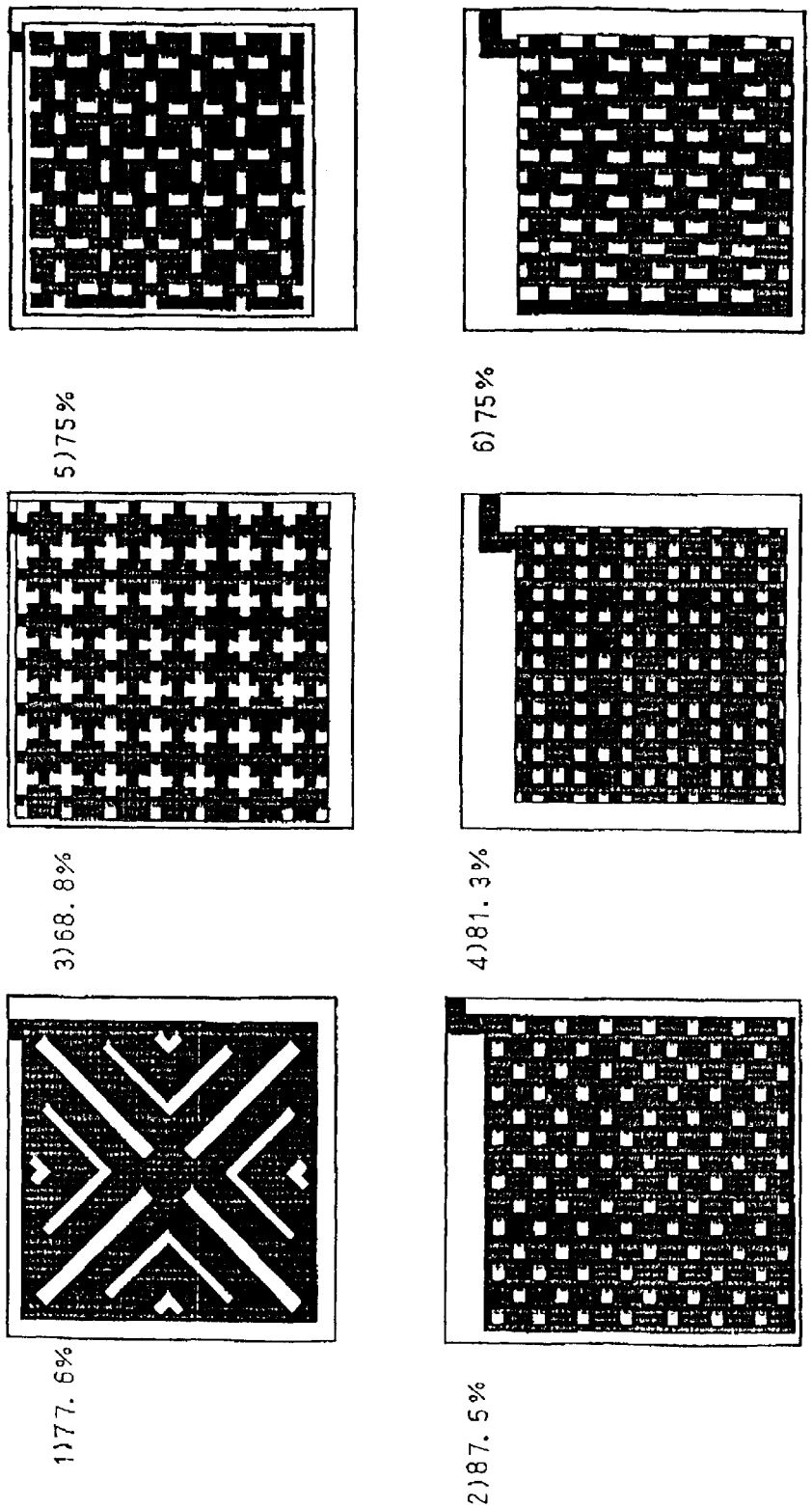
FIG. 8 illustrates evaluated patterns in Example 1.

In this example, various patterns of copper interconnects extending in two or more directions (FIG. 8) were prepared and each pattern was evaluated for a reduction rate of a copper interconnect thickness in chips from its wafer center and periphery. FIG. 8 is a plan view illustrating the evaluated patterns, where the black areas are interconnects and numeric values are interconnect occupancies.

Figure 6:
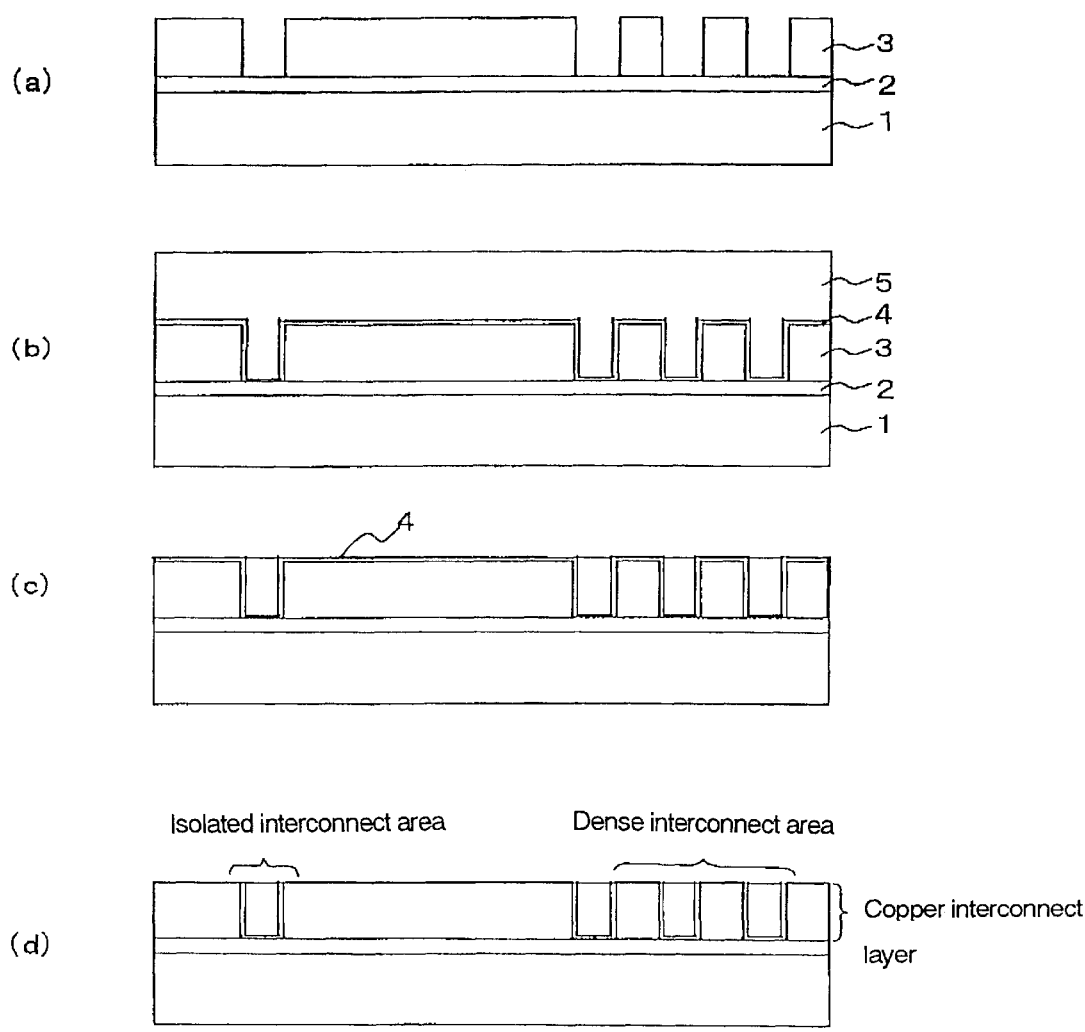
FIG. 6 shows a process for forming copper interconnects according a process for manufacturing a semiconductor device of this invention.

Copper interconnects were formed as illustrated in FIG. 6. As illustrated in FIG. 6(a), on a silicon substrate 1 are sequentially formed a silicon nitride film 2 with a thickness of 100 nm and a silicon oxide film 3 with a thickness of 1000 nm, and then a plurality of concaves reaching the silicon nitride film 2 were formed by dry etching in the silicon oxide film 3.

Subsequently, as illustrated in FIG. 6(b), on the whole surface was deposited a barrier metal film 4 consisting of Ta and TaN with a thickness of 15 nm by sputtering. On the surface was then deposited by sputtering a seed metal film consisting of copper for growing copper plating (not shown). The substrate was immersed in an aqueous solution of cupric sulfate and was subsequently subjected to electrolytic plating to form a copper film 5 and then annealing. The copper film 5 had a thickness of about 900 nm in its flat area. It is shown in FIG. 6(b).

Then, the copper film 5 was polished by CMP to level the substrate surface. After exposing the barrier metal film 4 (FIG. 6(c)), the wafer was further polished to be as shown in FIG. 6(d) to form damascene interconnects. At this point, the thickness of the copper film 5 was 300 nm.

Figure 9:
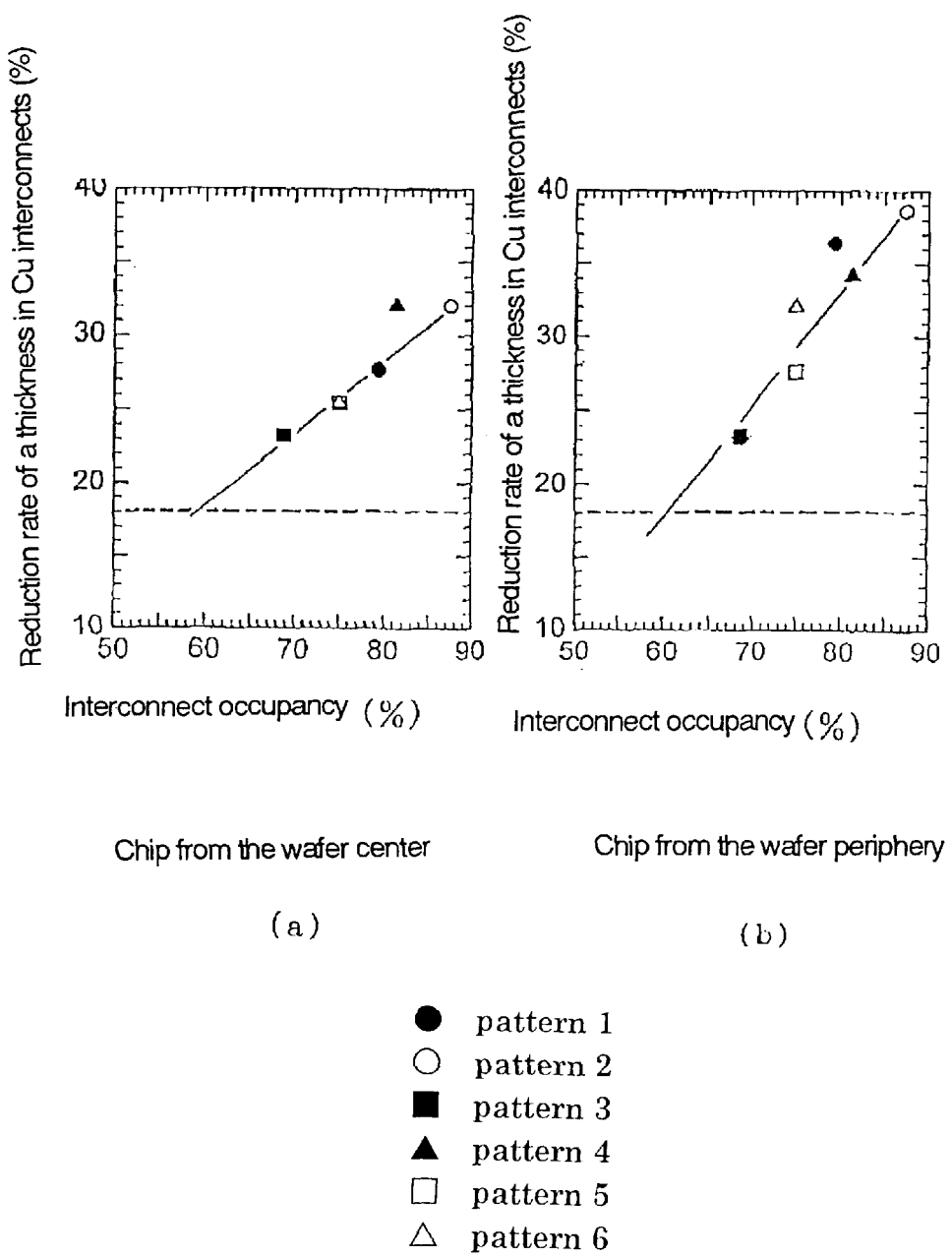
FIG. 9 shows relationship between an interconnect occupancy and a thickness reduction rate in copper interconnects.
Figure 19:
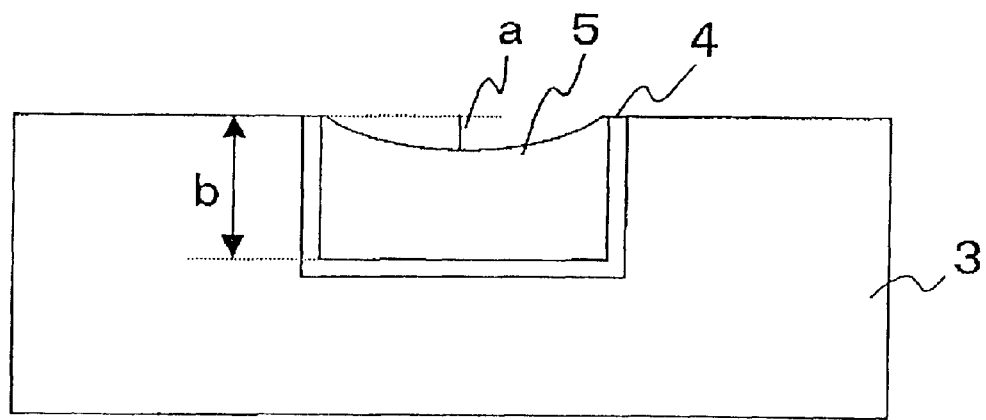
FIG. 19 is a cross section of copper interconnects in which dishing has occurred.

After preparing various patterns of copper interconnects illustrated in FIG. 8 as described above, the wafer was cut into chips, whereby their center and periphery were then evaluated for a thickness reduction rate of copper interconnects. A thickness reduction rate was defined as a value of a/b illustrated in FIG. 19. FIG. 9 shows evaluation results for a thickness reduction rate in each chip. Patterns 1 to 6 in FIG. 9 correspond to those illustrated in FIG. 8. A wafer central chip in FIG. 9 corresponds to a chip 51 in FIG. 7 while a wafer peripheral chip to a chip on the wafer in FIG. 7.

A thickness reduction rate generally tends to be higher in a wafer peripheral chip while lower in a wafer central chip. The results show that in both chips, an interconnect occupancy of 60% or less can give a required level of 18% or less for a thickness reduction rate.

The results show that a pattern shape affects a thickness reduction rate less than an interconnect occupancy and thus, controlling an interconnect occupancy is effective to ensure a given thickness.

Example 2

In this example, various patterns of copper interconnects comprising, as a main area, an area where copper interconnects extended over 100 μm or more in one direction were prepared and each pattern was evaluated for a reduction rate of a copper interconnect thickness in chips from its wafer center and periphery. Each pattern has a unique L/S value where L is an interconnect width and S is a distance between adjacent interconnects.

The copper interconnects were prepared as described in Example 1, except the interconnect pattern was changed. As with Example 1, the thickness of the copper interconnects was 300 nm.

After preparing the copper interconnects, a sheet resistance was determined for each pattern. A line/space ratio is shown in each figure. For example, "4/0.84" in FIG. 10 indicates that an interconnect width (line) is 4 μm and a distance between adjacent interconnects (space) is 0.84 μm.

A sheet resistance was determined by a two-probe or four-probe technique. A measured resistance is a resistance for one interconnect. The results are shown in FIGS. 10 to 13. In these figures, abscissa and ordinate are a sheet resistance and an accumulated probability, respectively. How to read these figures will be described with reference to the case of L/S=4/0.84 μm (circles) in FIG. 10. There are plotted a number of sheet resistances in this figure, where an accumulated probability is about 30% for sheet resistances of 70 mΩ/□ or less and about 85% for sheet resistances of 90 mΩ/□ or less.

Figure 10:
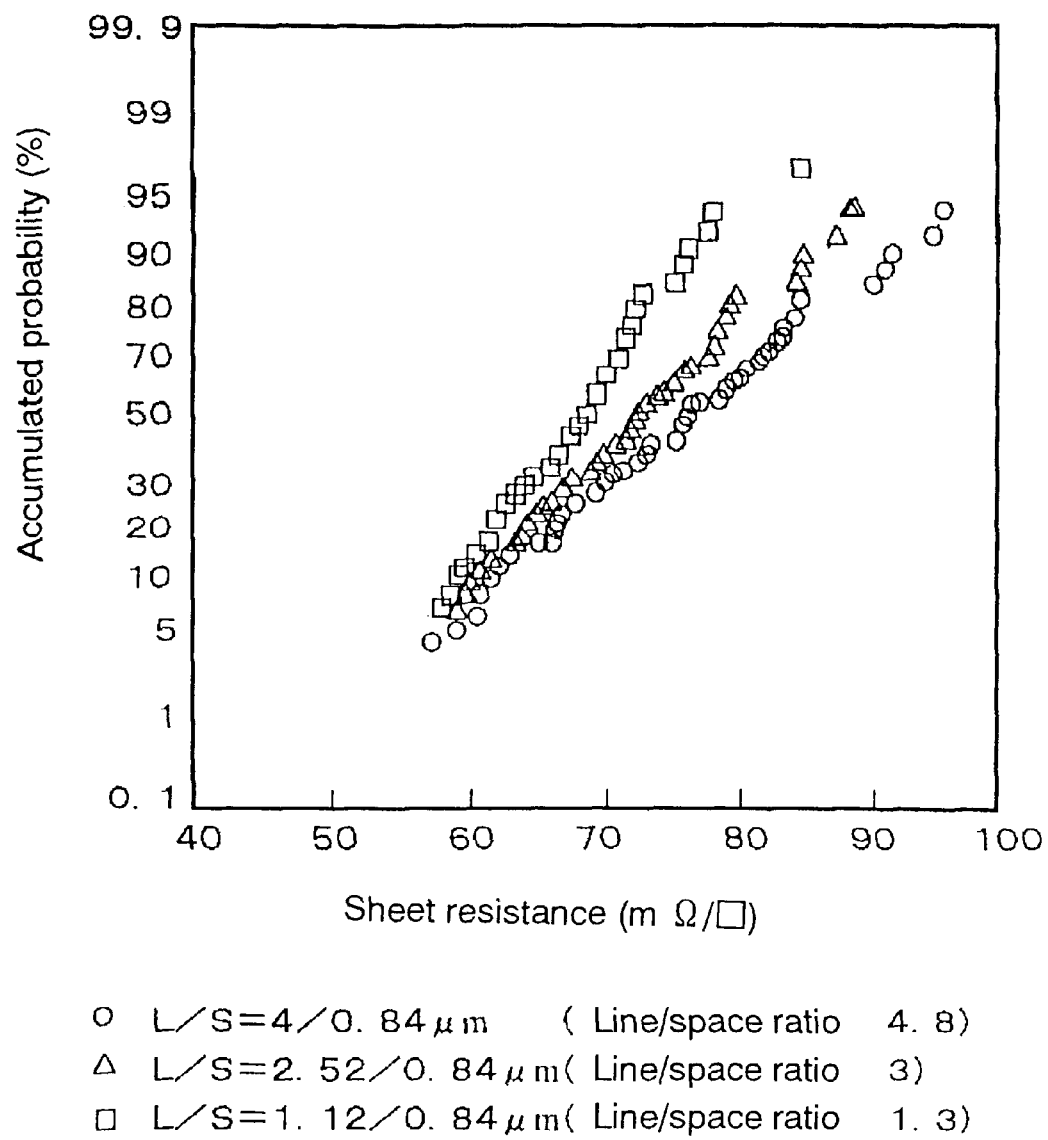
FIG. 10 illustrates relationship between a line/space ratio and an interconnect resistance.

Next, there will be described effects of a line/space ratio on a dispersion in a sheet resistance. In FIG. 10, the curves of L/S=2.52/0.84 μm (line/space ratio=3) and of L/S=1.12/0.84 μm (line/space ratio=1.3) markedly rise, indicating that there are a relatively small number of extremely high resistances, i.e., a smaller resistance dispersion. In contrast to these measurement distributions, the curve of L/S=4/0.84 μm (line/space ratio=4.8) less rises in the high-resistance range, indicating a larger resistance dispersion.

For sheet resistances measured in this example, Table 1 shows those corresponding to accumulated probabilities of 50% and 90%. A value corresponding to an accumulated probability of 50% is a median for the sheet resistances. For reducing a resistance, the value is preferably 75 mΩ/□, more preferably 72 mΩ/□. Meanwhile, a value corresponding to an accumulated probability of 90% may be used as an indicator of a dispersion in a sheet resistance.. The value is preferably 90 mΩ/□, more preferably 85 mΩ/□.

TABLE 1

Figure 11:
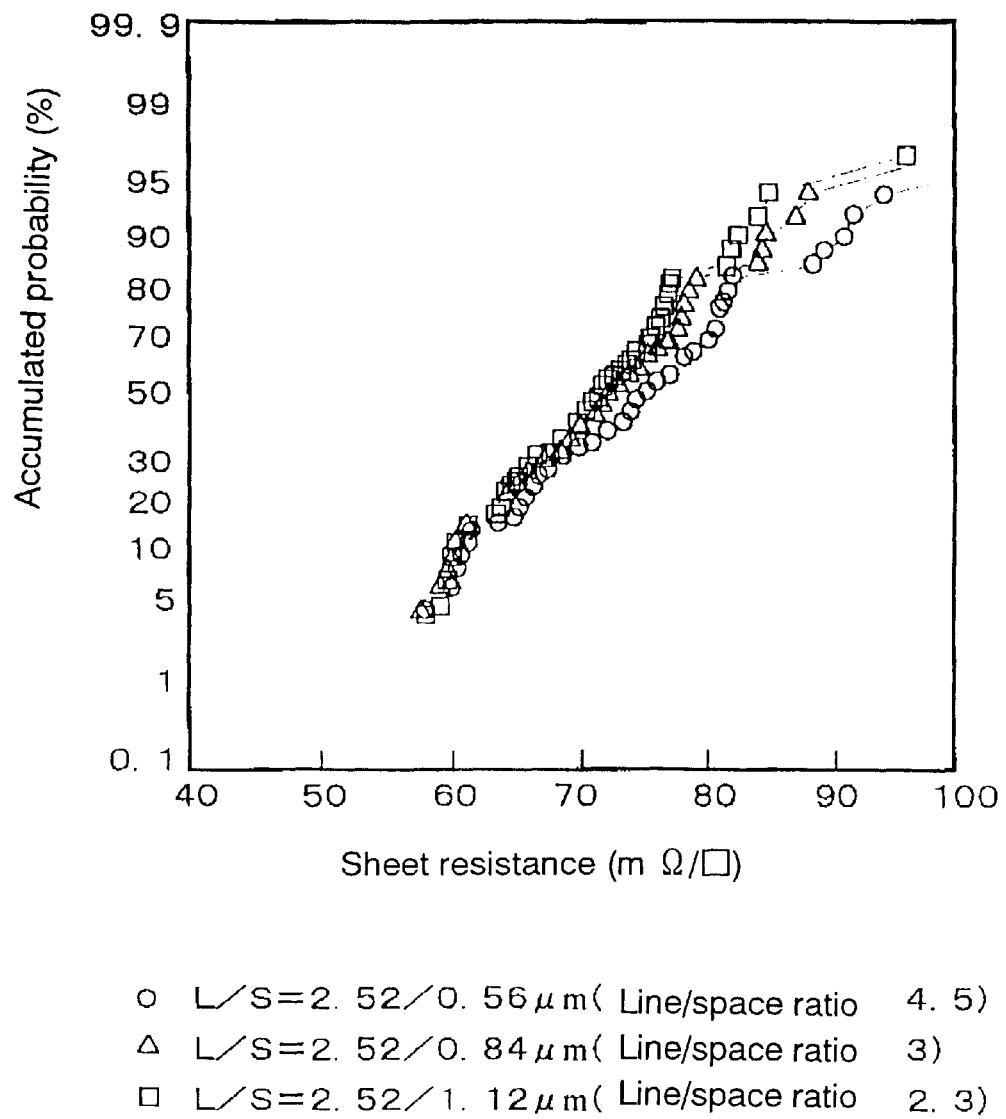
FIG. 11 illustrates relationship between a line/space ratio and an interconnect resistance.
Figure 12:
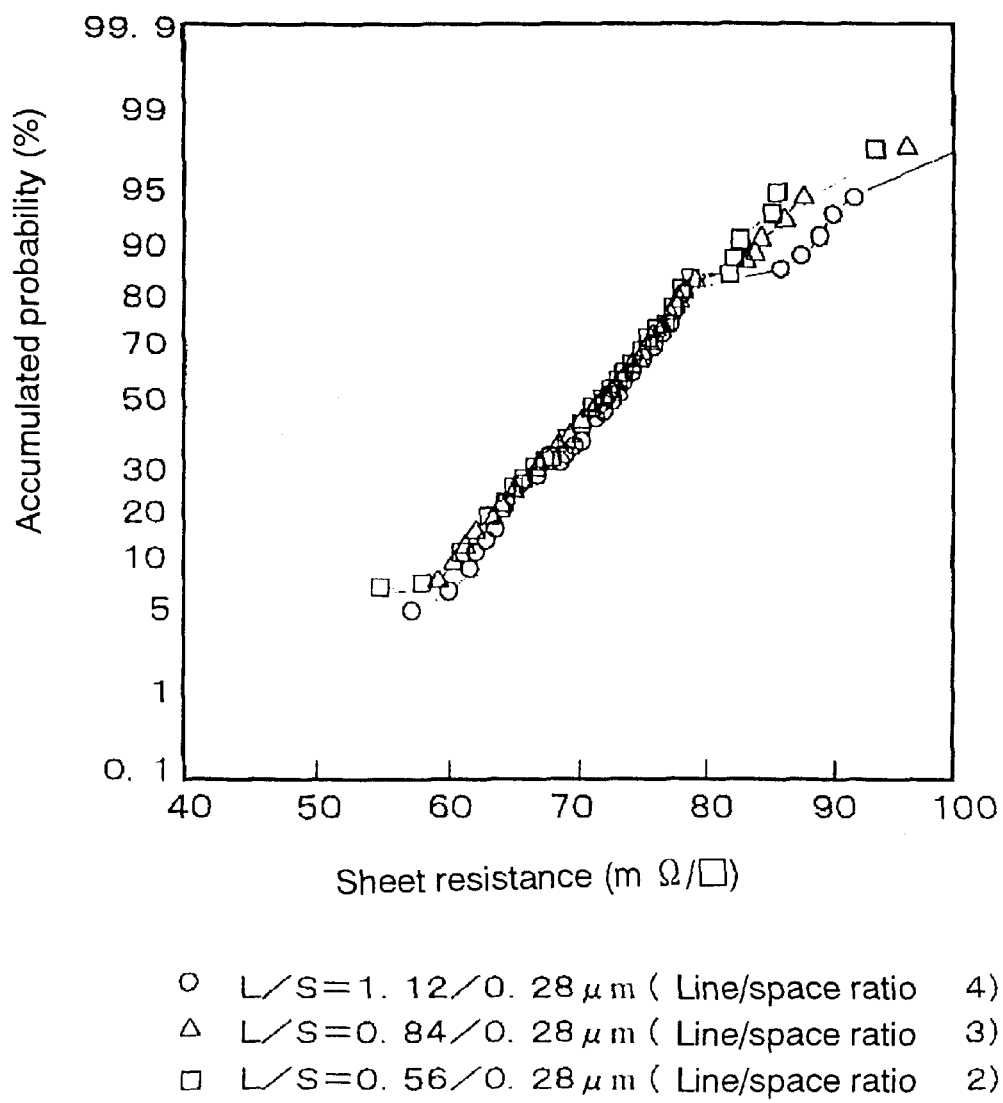
FIG. 12 illustrates relationship between a line/space ratio and an interconnect resistance.
Figure 13:
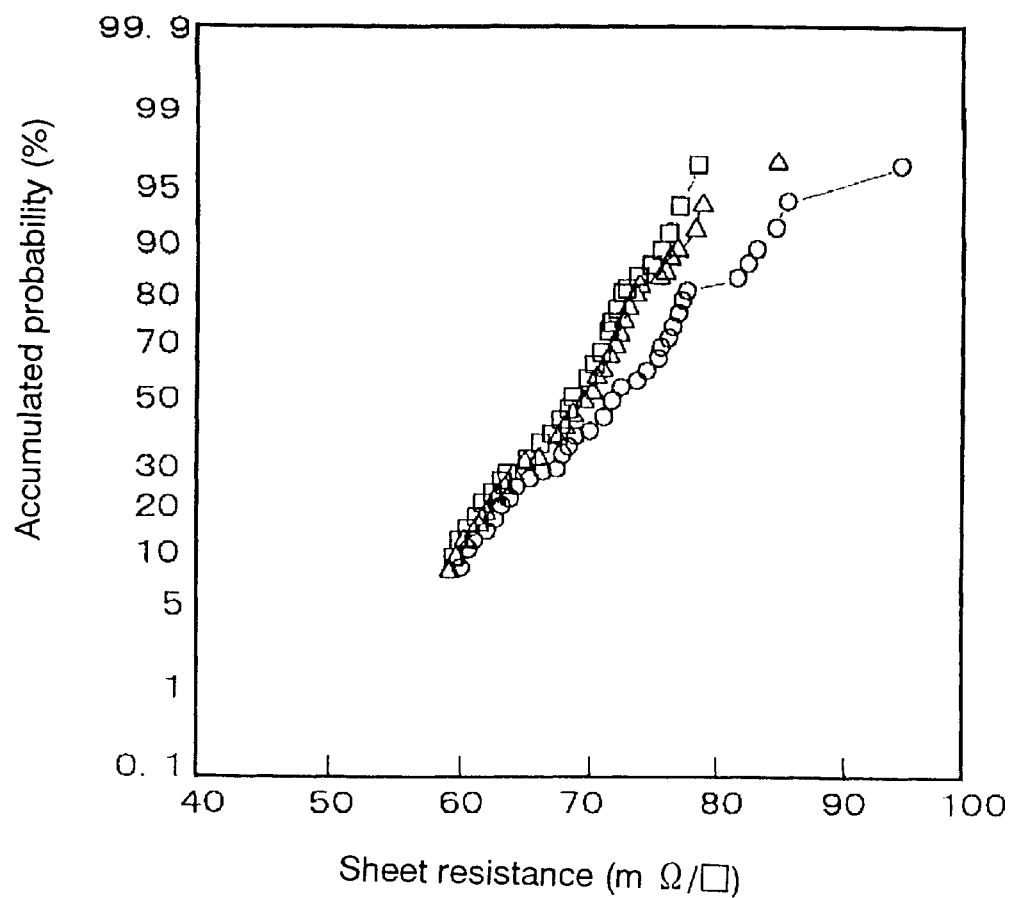
FIG. 13 illustrates relationship between a line/space ratio and an interconnect resistance.

| No | FIG. No. | Interconnect width (μm) | Interconnect distance (μm) | Line/space ratio | Sheet resistance corresponding to an accumulated probability of 50% (m Ω/□) | Sheet resistance corresponding to an accumulated probability of 90% (m Ω/□) |
|---|---|---|---|---|---|---|
| 1 | FIG. 10 | 4 | 0.84 | 4.8 | 76 | 92 |
| 2 | FIG. 10 | 2.52 | 0.84 | 3 | 72 | 84 |
| 3 | FIG. 10 | 1.12 | 0.84 | 1.3 | 68 | 77 |
| 4 | FIG. 11 | 2.52 | 0.56 | 4.5 | 75 | 90 |
| 5 | FIG. 11 | 2.52 | 0.84 | 3 | 72 | 84 |
| 6 | FIG. 11 | 2.52 | 1.12 | 2.3 | 70 | 81 |
| 7 | FIG. 12 | 1.12 | 0.28 | 4 | 72 | 88 |
| 8 | FIG. 12 | 0.84 | 0.28 | 3 | 71 | 83 |
| 9 | FIG. 12 | 0.56 | 0.28 | 2 | 70 | 81 |
| 10 | FIG. 13 | 0.84 | 0.28 | 3 | 71 | 85 |
| 11 | FIG. 13 | 0.84 | 0.56 | 1.5 | 70 | 79 |
| 12 | FIG. 13 | 0.84 | 0.84 | 1 | 69 | 75 |
| 13 | — | 20 | 2 | 10 | 88 | 100 or higher |
| 14 | — | 10 | 2 | 5 | 82 | 98 |

TABLE 1-continued

| No | FIG. No. | Interconnect width (μm) | Interconnect distance (μm) | Line/space ratio | Sheet resistance corresponding to an accumulated probability of 50% (m Ω/□) | Sheet resistance corresponding to an accumulated probability of 90% (m Ω/□) |
|---|---|---|---|---|---|---|
| 15 | — | 8 | 2 | 4 | 79 | 93 |
| 16 | — | 10 | 1 | 10 | 83 | 100 or higher |
| 17 | — | 10 | 2 | 5 | 81 | 98 |

The above results indicate that a line/space ratio of 4.5 or less, preferably 4 or less can reduce a sheet resistance and its dispersion. It can be also seen that a line/space ratio of 3 or less can more effectively reduce a dispersion in a sheet resistance, regardless of an interconnect width. For example, a dispersion in a sheet resistance is reduced in any of Nos. 2 and 5 where an interconnect width is 2.52 μm and Nos. 8 and 10 where an interconnect width is 0.84 μm.

For a line/space ratio of more than 5, a sheet resistance corresponding to an accumulated probability of 90% is more than 98 and a sheet resistance is extremely dispersed. Thus, a line/space ratio is preferably up to 5 when several types of interconnects with different line/space ratios are formed on the same IC. An area where a line/space ratio is significantly higher leads to significant dishing and erosion and a large dispersion in a resistance.

Example 3

On a semiconductor device was formed an MOSFET, on which were then deposited five interconnect layers, to prepare a logic IC. Table 2 shows a profile for each interconnect layer.

TABLE 2

|  | Thickness of copper interconnects (nm) | L/S (line/space ratio) in area (a) | Interconnect occupancy for the whole interconnect layer (%) |
|---|---|---|---|
| Lowest layer | 30 | 10/3 (3.3) | 55 |
| 2nd layer | 30 | 10/3 (3.3) | 55 |
| 3rd layer | 30 | 10/3 (3.3) | 55 |
| 4th layer | 30 | 10/3 (3.3) | 55 |
| 5th layer | 60 | 20/7 (2.9) | 75 |

The prepared IC exhibited excellent high-speed operability. In particular, the copper interconnects were made with a designed thickness; matching properties in operation with a high frequency circuit were satisfactory; and an yield was improved.

As described above, in this invention, an interconnect occupancy and a line/space ratio are adjusted to appropriate ranges. It can, therefore, effectively prevent dishing and erosion, as well as increase and dispersion in an interconnect resistance.

What is claimed is:

1. A process for manufacturing a semiconductor device comprising the steps of depositing an insulating film on a semiconductor substrate surface including a device-forming area and then forming a concave in the insulating film within the device-forming area; depositing a barrier metal film in the concave and forming a copper film to fill the concave; and removing the copper film formed in the area outside the concave by chemical mechanical polishing to form copper interconnects, wherein the interconnect occupancy of the copper interconnects in the device-forming area is 10 to 60%.

2. The process for manufacturing a semiconductor device as claimed in claim 1 where the interconnect occupancy of the copper interconnects in the device-forming area is 10 to 60%.

3. The process for manufacturing a semiconductor device as claimed in claim 1 where the copper interconnects have a thickness of 350 nm or less.

4. The process for manufacturing a semiconductor device as claimed in claim 1 where the interconnect layer is the lowest interconnect layer in the plurality of interconnect layers deposited on the semiconductor substrate.

5. The process for manufacturing a semiconductor device as claimed in claim 1 where the interconnect layer further comprises a probe pad area and an interconnect occupancy in the probe pad area is 70 to 90%.

6. A process for manufacturing a semiconductor device comprising the steps of depositing an insulating film on a semiconductor substrate surface including a device-forming area and then forming a plurality of concaves extending over 100 μm or more in one direction within the device-forming area; depositing a barrier metal film in the concave and forming a copper film to fill the concave; and removing the copper film formed in the area outside the concave by chemical mechanical polishing to form a plurality of copper interconnects, wherein a line/space ratio in the interconnect area is 4.0 or less, and the interconnect occupancy of the copper interconnects in the device-forming area is 10 to 60%.

7. A process for manufacturing a semiconductor device comprising the steps of depositing an insulating film on a semiconductor substrate surface including a device-forming area and then forming a plurality of concaves extending over 100 μm or more in one direction within the device-forming area; depositing a barrier metal film in the concave and forming a copper film to fill the concave; and removing the copper film formed in the area outside the concave by chemical mechanical polishing to form a plurality of copper interconnects, wherein an average line/space ratio in the interconnect area is 4.5 or less, and wherein the interconnect occupancy of the copper interconnects in the device-forming area is 10 to 60%.

* * * * *